US008918139B2

(12) United States Patent
Noellert et al.

(10) Patent No.: US 8,918,139 B2
(45) Date of Patent: Dec. 23, 2014

(54) ELECTRONIC DEVICE WITH DYNAMIC AMPLIFIER LINEARITY CONTROL

(75) Inventors: William J. Noellert, Sunnyvale, CA (US); Ronald W. Dimpflmaier, Los Gatos, CA (US); Nicholas W. Lum, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 179 days.

(21) Appl. No.: 13/356,294

(22) Filed: Jan. 23, 2012

(65) Prior Publication Data

US 2013/0190038 A1 Jul. 25, 2013

(51) Int. Cl.
*H04M 1/00* (2006.01)
(52) U.S. Cl.
USPC ........... 455/552.1; 455/77; 455/313; 455/334
(58) Field of Classification Search
USPC ................. 455/75–82, 90.3, 137, 138, 232.1, 455/234.1, 296, 313, 334, 550.1, 552.1
See application file for complete search history.

(56) References Cited

U.S. PATENT DOCUMENTS

| 5,603,113 | A | * | 2/1997 | De Loe, Jr. ................ 455/234.1 |
| 6,298,221 | B1 | | 10/2001 | Nguyen |
| 7,265,629 | B2 | | 9/2007 | Manku |
| 7,295,813 | B2 | | 11/2007 | Haub et al. |
| 8,255,009 | B2 | | 8/2012 | Sorensen et al. |
| 2002/0072340 | A1 | * | 6/2002 | Hutchison et al. ............ 455/127 |
| 2005/0075077 | A1 | * | 4/2005 | Mach et al. ................ 455/67.13 |
| 2008/0032639 | A1 | * | 2/2008 | Kee et al. ....................... 455/110 |
| 2010/0081391 | A1 | * | 4/2010 | Suzuki et al. .............. 455/67.11 |
| 2011/0250853 | A1 | | 10/2011 | Camuffo et al. |

OTHER PUBLICATIONS

Qualcomm Inc. A Low-IF CMOS Simultaneous GPS Receiver Integrated in a Multimode Transceiver, IEEE 2007 Custom Integrated Circuits Conference (CICC), 2007, p. 107-110.

* cited by examiner

*Primary Examiner* — Nhan Le
(74) *Attorney, Agent, or Firm* — Treyz Law Group; G. Victor Treyz; Jason Tsai

(57) ABSTRACT

An electronic device may include antenna structures. Wireless transmitter circuitry such as cellular telephone transmitter circuitry and wireless local area network circuitry may transmit signals using the antenna structures. A wireless receiver may receive signals from the antenna structures through an adjustable-linearity amplifier. The wireless receiver may operate in a receive band such as a satellite navigation system receive band. During operation of the electronic device, control circuitry in the device may analyze the frequencies and powers of the transmitted signals to determine whether there is a potential for interference for the receive band to be generated in the adjustable-linearity amplifier. In response to determining that there is a potential for interference, the control circuitry may increase the linearity of the adjustable-linearity amplifier.

12 Claims, 6 Drawing Sheets

ELECTRONIC DEVICE WITH DYNAMIC AMPLIFIER LINEARITY CONTROL

BACKGROUND

This relates generally to electronic devices and, more particularly, to reducing signal interference in electronic devices such as wireless electronic devices.

Electronic devices such as cellular telephones and other devices often contain wireless communications circuitry. The wireless communications circuitry may include, for example, cellular telephone transceiver circuits for communicating with cellular telephone networks. Wireless communications circuitry in an electronic device may also include wireless local area network circuits, satellite navigation receiver circuitry, and other wireless circuits.

As devices are enhanced to include circuitry that covers more communications bands of interest, it can be challenging to ensure that wireless receivers do not become overwhelmed with radio-frequency interference. If care is not taken, radio-frequency interference from noise sources such as transmitter circuits in a device can adversely affect the performance of a wireless receiver.

It would therefore be desirable to be able to provide ways to mitigate the effects of signal interference in electronic devices that contain sensitive circuitry such as wireless receivers.

SUMMARY

An electronic device may include antenna structures. Wireless transmitter circuitry such as cellular telephone transmitter circuitry and wireless local area network circuitry may transmit signals using the antenna structures. A wireless receiver may receive signals from the antenna structures through an adjustable-linearity amplifier. The wireless receiver may be a satellite navigation system receiver that operates in a satellite navigation system receive band.

During operation of the electronic device, control circuitry in the device may analyze the frequencies and powers of the transmitted signals to determine whether there is a potential for interference for the receive band to be generated in the adjustable-linearity amplifier. For example, the control circuitry can determine whether the difference in transmit frequencies between a transmitted cellular telephone signal and a transmitted wireless local area network signal falls in the receive band of the satellite navigation system receiver. The control circuitry may also compare the transmit power of each of the transmitted signals to a respective threshold value.

In response to determining that there is a potential for interference, the control circuitry may increase the linearity of the adjustable-linearity amplifier. The linearity of the adjustable-linearity amplifier may otherwise be set to a lower linearity setting to conserve power.

Further features of the invention, its nature and various advantages will be more apparent from the accompanying drawings and the following detailed description.

DETAILED DESCRIPTION

Figure 1:
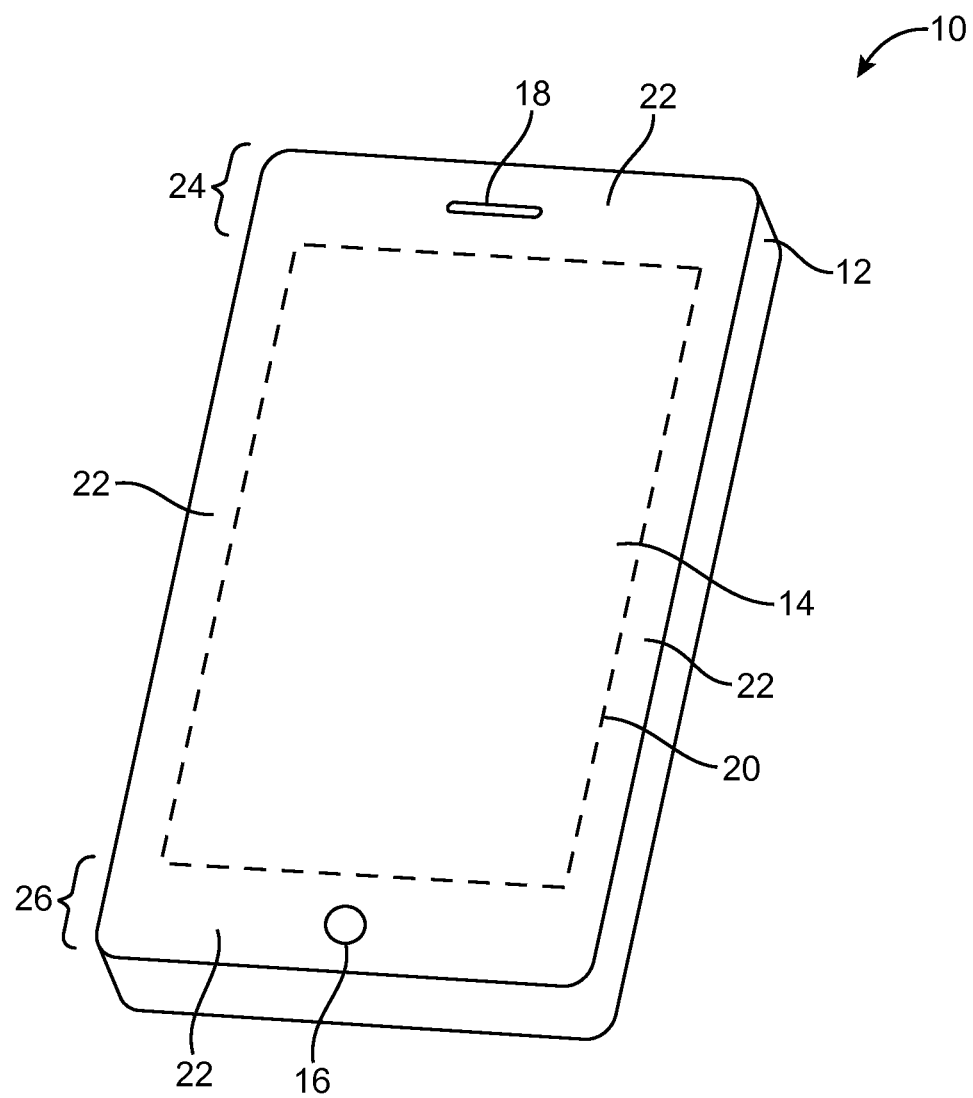
FIG. 1 is a perspective view of an illustrative electronic device with wireless circuitry in accordance with an embodiment of the present invention.

Electronic devices such as electronic device 10 of FIG. 1 may be provided with wireless communications circuitry such as receiver circuitry that is sensitive to radio-frequency signal interference. The wireless communications circuitry may be used to support wireless communications in one or more wireless communications bands. To reduce interference with the receiver circuitry of device 10, device 10 may dynamically adjust the linearity of low noise amplifier circuitry that used in amplifying receiver signals in device 10. In situations in which there is no potential for interference with the receiver circuitry, such as when noise sources within the device are not active, the amplifier may be operated in a low power mode to conserve power. In situations in which radio-frequency transmitters or other noise sources are active, the linearity of the amplifier circuitry can be temporarily increased. Increased amplifier linearity will tend to result in the reduction of the magnitude of mixing products generated within the amplifier and will therefore decrease interference with the receiver circuitry.

Device 10 of FIG. 1 may be a computer monitor with an integrated computer, a desktop computer, a television, a notebook computer, or other portable electronic equipment such as a cellular telephone, a tablet computer, a media player, a wrist-watch device, a pendant device, an earpiece device, or other compact portable device.

As shown in FIG. 1, device 10 may have a housing such as housing 12. Housing 12 may be formed from materials such as plastic, metal, carbon fiber and other fiber composites, ceramic, glass, wood, other materials, or combinations of these materials. Device 10 may be formed using a unibody construction in which some or all of housing 12 is formed from a single piece of material (e.g., a single cast or machined piece of metal, a single piece of molded plastic, etc.) or may be formed from frame structures, housing sidewall structures, and other structures that are assembled together using fasteners, adhesive, and other attachment mechanisms.

Device 10 may include components such as buttons, input-output port connectors, ports for removable media, sensors, microphones, speakers, status indicators, and other device components. As shown in FIG. 1, for example, device 10 may include buttons such as menu button 16. Device 10 may also include a speaker port such as speaker port 18 (e.g., to serve as an ear speaker for device 10).

One or more antennas may be formed in device 10. The antennas may, for example, be formed in locations such as locations 24 and 26 to provide separation from the conductive elements of display 14. Antennas may also be located at the corners of a device housing, along device housing edges, in the middle of a device housing (e.g., in the center of a rear housing wall), or elsewhere in an electronic device. The configuration of FIG. 1 is merely illustrative.

Antennas may be formed using single band and multiband antenna structures. Examples of communications bands that may be covered by the antennas include cellular telephone bands (e.g., bands from about 700 MHz to about 2200 MHz or bands at higher or lower frequencies), satellite navigation bands (e.g., the Global Positioning System band at 1575 MHz, satellite navigation bands associated with other satellite navigation systems such as GLONASS, etc.), wireless local area network bands such as the IEEE 802.11 (WiFi®) bands at 2.4 GHz and 5 GHz and the Bluetooth band at 2.4 GHz, etc. Examples of antenna configurations that may be used for the antennas in device 10 include monopole antennas, dipole antennas, strip antennas, patch antennas, inverted-F antennas, coil antennas, planar inverted-F antennas, open slot antennas, closed slot antennas, loop antennas, hybrid antennas that include antenna structures of multiple types, or other suitable antenna structures.

Device 10 may include one or more displays such as display 14. Display 14 may be a liquid crystal display (LCD), an organic light-emitting diode (OLED) display, a plasma display, an electrowetting display, an electrophoretic display, or a display using other display technologies. Display 14 may be insensitive to touch or a touch sensor may be incorporated into display 14 (i.e., display 14 may be a touch screen). The touch sensor may be an acoustic touch sensor, a resistive touch sensor, a piezoelectric touch sensor, a capacitive touch sensor (e.g., a touch sensor based on an array of indium tin oxide capacitor electrodes), or a touch sensor based on other touch technologies.

Display 14 may be covered by a transparent planar conductive member such as a layer of glass or plastic. The cover layer may extend over substantially all of the front face of device 10 (as an example). The rectangular center portion of the cover glass (surrounded by dashed line 20 in FIG. 1) contains an array of image pixels and is sometimes referred to as the active portion of display 20. The active portion of display 14 may extend to the edges of device housing 12 (e.g., in a borderless display design) or peripheral border portion 22 of display 14 may form an inactive region without underlying active pixels.

Figure 2:
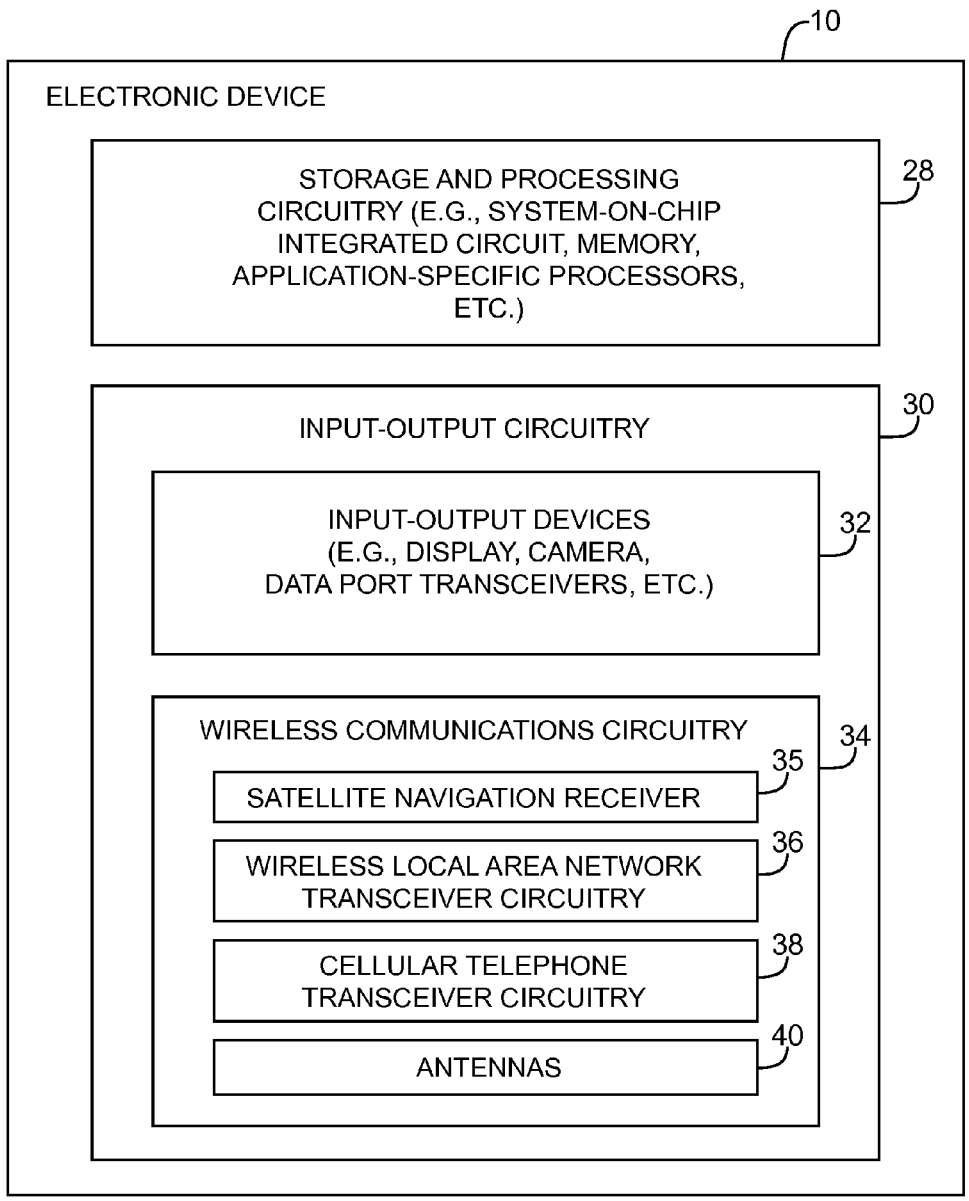
FIG. 2 is a diagram of illustrative circuitry that may be used in an electronic device in accordance with an embodiment of the present invention.

A schematic diagram of electronic device 10 is shown in FIG. 2. As shown in FIG. 2, electronic device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more system on chip (SoC) integrated circuits, microprocessors, microcontrollers, digital signal processors, baseband processors, power management units, audio codec chips, application specific integrated circuits, memory controllers, timing controllers, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Circuitry 28 may be configured to implement control algorithms that control the use of amplifier circuitry in device 10. For example, circuitry 28 may be configured to implement a control algorithm that adjusts the linearity of a radio-frequency input amplifier (sometimes referred to as a low noise amplifier) in device 10. The radio-frequency input amplifier may be coupled to the input of a sensitive wireless receiver circuit and may be used to boost incoming signal strength to a level that is suitable for the wireless receiver circuitry.

Decisions on how to adjust the linearity of the amplifier may be made in real time based on which wireless frequencies are being used by device 10. For example, linearity settings may be selected based on which communications bands and/or channels are being actively used in transmitting signals. When the transmit frequencies and transmit powers being used in device 10 are such that no significant interference for the receiver is being produced in the amplifier, the amplifier can be operated with a relatively low amount of linearity to conserve power. When, however, the currently used transmit frequencies and powers give rise to a potential for receiver interference to be produced within the amplifier due to amplifier nonlinearities, circuitry 28 can dynamically increase the linearity of the amplifier. When operated with the increased linearity, the amount of noise produced at the output of the amplifier (and therefore at the input to the sensitive receiver circuitry) will tend to be reduced.

Input-output circuitry 30 may be used to allow data to be supplied to device 10 and to allow data to be provided from device 10 to external devices. Input-output circuitry 30 may include input-output devices 32. Input-output devices 32 may include touch screens, buttons, joysticks, click wheels, scrolling wheels, touch pads, key pads, keyboards, microphones, speakers, tone generators, vibrators, cameras, sensors, light-emitting diodes and other status indicators, transceiver circuits associated with data ports, etc. A user can control the operation of device 10 by supplying commands through input-output devices 32 and may receive status information and other output from device 10 using the output resources of input-output devices 32.

Wireless communications circuitry 34 may include radio-frequency (RF) transceiver circuitry formed from one or more integrated circuits, power amplifier circuitry, low-noise input amplifiers, passive RF components, one or more antennas, impedance matching circuits, switches, filters, and other circuitry for handling RF wireless signals. Wireless signals can also be sent using light (e.g., using infrared communications).

Wireless communications circuitry 34 may include satellite navigation system receiver circuitry 35 such as Global Positioning System (GPS) receiver circuitry operating at 1575 MHz and/or receiver circuitry using the Global Navigation System (GLONASS) at 1605 MHz or other satellite navigation systems. Wireless local area network transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as bands at about 700 MHz to about 2200 MHz or other cellular telephone bands of interest. Wireless communications circuitry 34 can include circuitry for other short-range and long-range wireless links if desired. For example, wireless communications circuitry 34 may include wireless circuitry for receiving radio and television signals, paging circuits, near field communications circuitry, 60 GHz communications circuitry, etc. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structure, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna and another type of antenna may be used in forming a remote wireless link. If desired, a single antenna with one or more feeds may be used to handle multiple types of signals. For example, a single antenna may be used to handle wireless local area network traffic at 2.4 GHz, satellite navigation signals, and cellular telephone signals (as an example).

The circuitry of device 10 may include circuitry that is sensitive to interference. For example, satellite navigation receiver 35 or receiver circuitry associated with wireless local area network transceiver circuitry 36 or cellular telephone transceiver circuitry 38 may be vulnerable to radio-frequency interference. Device 10 may use control circuitry 28 to control low noise amplifiers in device 10 in real time to minimize interference.

Figure 3:
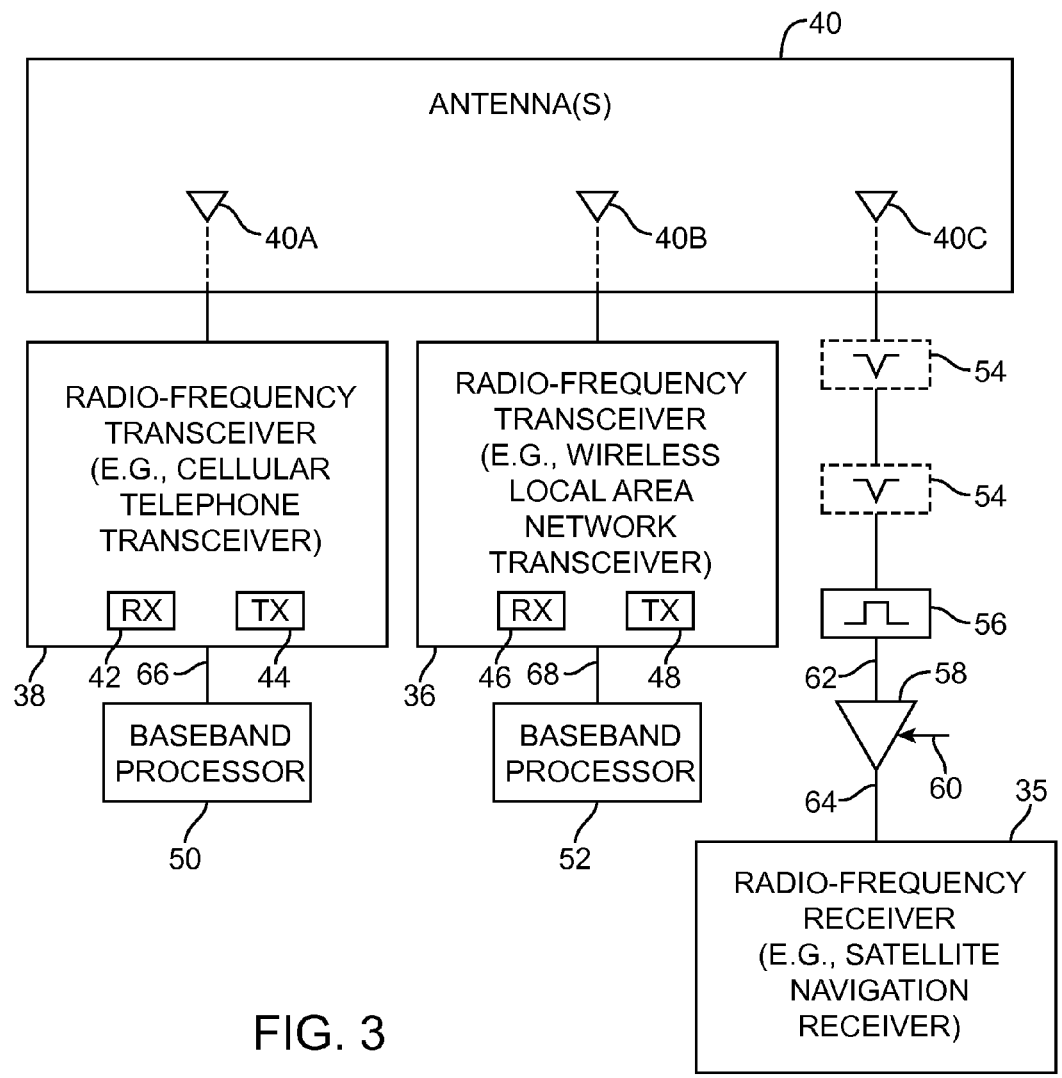
FIG. 3 is a diagram showing how wireless circuitry in a device may include multiple potentially active transmitters and sensitive circuitry such as a wireless receiver in accordance with an embodiment of the present invention.

FIG. 3 is a circuit diagram of illustrative wireless circuitry 34 in device 10. As shown in FIG. 3, antenna structures 40 may include one or more antennas such as antennas 40A, 40B, and 40C. Each antenna may be coupled to a respective radio-frequency transceiver or multiple transceivers may be coupled to a shared antenna (e.g., using switching circuitry, filter circuitry, impedance matching circuitry, etc.). As an example, antenna 40A may be coupled to a first transceiver such as transceiver 38, antenna 40B may be coupled to a second transceiver such as transceiver 36, and antenna 40C may be coupled to a third transceiver such as receiver 35. As another example, transceivers 38, 36, and 35 may be coupled to one common antenna.

Radio-frequency transceiver 38 may include a receiver such as receiver 42 and a transmitter such as transmitter 44. Baseband processor 50 may receive data to transmit from a data source in device 10 (see, e.g., storage and processing circuitry 28 of FIG. 2) and may provide corresponding signals to radio-frequency transceiver 38 (i.e., transmitter 44) via path 66. During signal reception operations, antenna signals that have been received from antenna structures 40 by receiver 42 in transceiver 38 may be passed to baseband processor 50 via path 66 and corresponding data may be provided to storage and processing circuitry 28 by baseband processor 50.

Radio-frequency transceiver 36 may include a receiver such as receiver 46 and a transmitter such as transmitter 48. Baseband processor 52 may receive data to transmit from a data source in device 10 and may provide corresponding signals to transmitter 48 in radio-frequency transceiver 36 via path 68. Antenna signals that have been received from antenna structures 40 by receiver 46 in transceiver 36 may be passed to baseband processor 52 via path 68 and corresponding data may be provided to storage and processing circuitry 28 by baseband processor 52.

Receiver 35 may be a receiver such as a satellite navigation system receiver that receives antenna signals from antenna structures 40 via low noise amplifier 58. Band pass filter 56 may be used to help reject out-of-band signals. If desired, additional filters 54 such as a cellular telephone notch filter and a wireless local area network notch filter may be interposed in the path between antenna structures 40 and radio-frequency receiver 35. Additional filters 54 will, however, exhibit insertion losses. By properly controlling the linearity of low noise amplifier 58 using linearity control signals applied to linearity control input 60, interference for receiver 35 may be reduced, eliminating or at least reducing the need for filters 54 and thereby reducing insertion losses in the path from antenna structures 40 to receiver 35.

The paths that are used to connect transceiver circuitry 38, transceiver circuitry 36, and receiver circuitry 35 to antenna structures 40 may be formed from transmission line structures such as coaxial cable structures, microstrip transmission line structures, or stripline transmission line structures. Impedance matching filters, switches, diplexers, duplexers, connectors, and other circuitry may be interposed in these paths if desired.

Adjustable-linearity amplifier 58 may receive antenna signals from path 62 and may produce correspondingly amplified output signals on path 64. The amplified signals may be received by receiver 35 from path 64. Low noise amplifiers such as amplifier 58 may be used to boost the strength of radio-frequency signals that have been received from antenna structures (antenna) 40. Ideally, these low noise amplifiers would exhibit perfectly linear amplification (i.e., their outputs would perfectly track their inputs). In practice, however, even well designed amplifiers exhibit a finite amount of non-linearity.

There is a potential for interference to be generated due to amplifier non-linearity. Consider, as an example, a situation in which device 10 is using wireless local area network transceiver circuitry 36 to transmit signals at a channel near the high end of the 2.4 GHz WiFi® band (2402-2480 MHz) while simultaneously using cellular telephone transceiver circuitry 38 to transmit signals in a frequency range of about 880-915 MHz (i.e., the uplink frequency range of Long Term Evolution band 8). Due to free-space electromagnetic coupling and/or coupling through shared conductive structures such as portions of antenna structures 40, some of these transmitted signals are conveyed to the input of low noise amplifier 58.

As a result of the simultaneous presence of the WiFi (or Bluetooth®) and cellular telephone signals, a corresponding difference signal (sometimes referred to as a mixing product) may be generated within low noise amplifier 58. This difference signal lies within the satellite navigation receiver band and therefore has the potential to interfere with proper operation of satellite navigation system receiver 35. A similar satellite navigation system interference scenario may arise when device 10 is using wireless local area network transceiver circuitry 36 to transmit signals at a channel near the low end of the 2.4 GHz WiFi® band (2402-2480 MHz) while simultaneously using cellular telephone transceiver circuitry 38 to transmit signals in a frequency range of about 824-849 MHz (i.e., the uplink frequency range of Long Term Evolution band 5 or band class 0 for Code Division Multiple Access systems).

The amount of satellite navigation system interference that is generated in these potential interference situations is proportional to the amount of non-linearity exhibited by low noise amplifier 58. Amplifier 58 can be placed into different modes of operation associated with different respective amounts of linearity by applying control signals to control input 60 using control circuitry 28 (FIG. 2). If amplifier 58 is configured to exhibit a relatively large amount of non-linearity, a relatively large interference signal will be generated in low noise amplifier 58. This interference signal will be provided to the input of satellite navigation system receiver 35 over path 64 and may prevent proper operation of satellite navigation system functions. If, however, amplifier 35 is configured to exhibit a relatively small amount of non-linearity, a relatively small interference signal will be generated in low noise amplifier 58 and satellite navigation system receiver 35 will not be significantly impaired.

Figure 4:
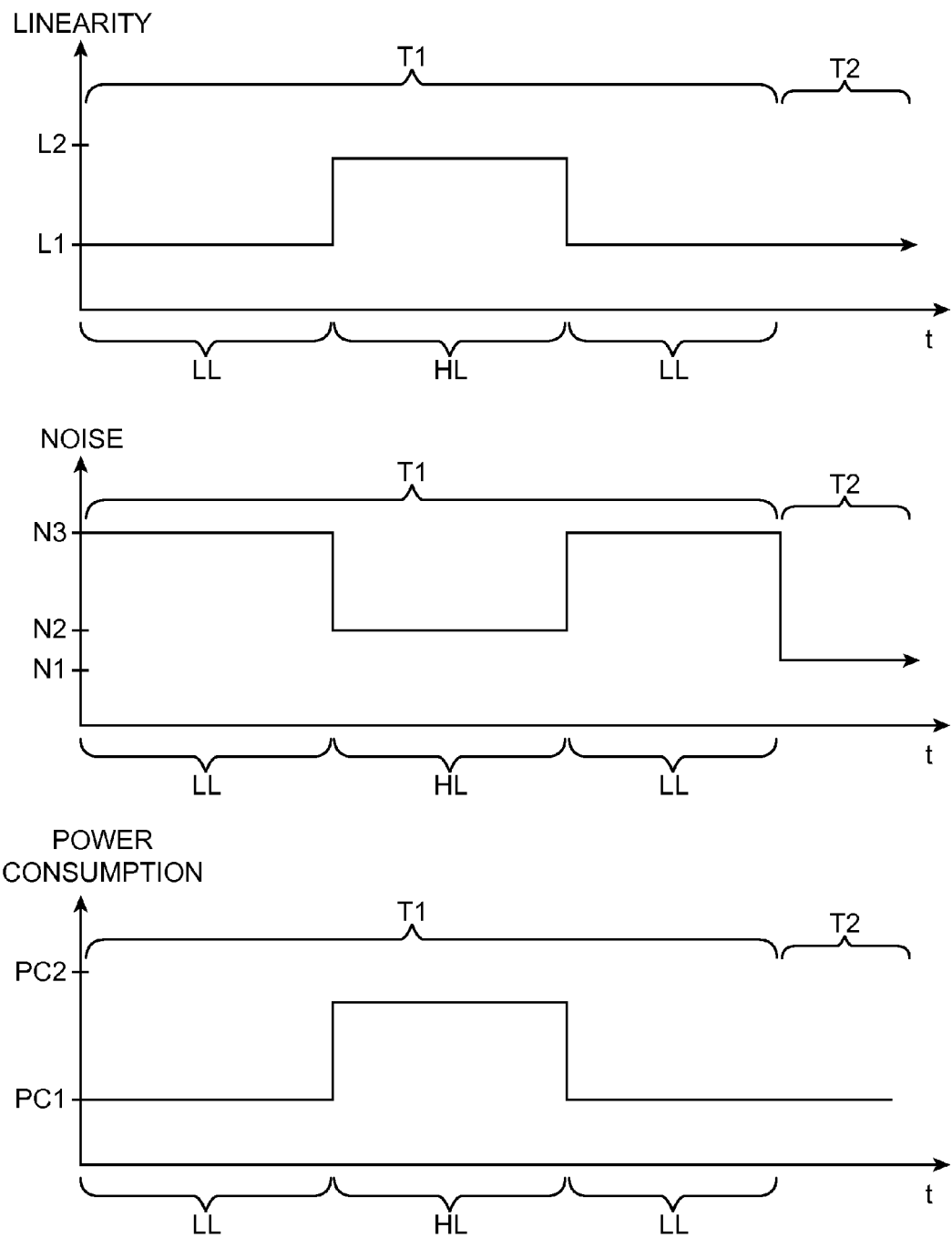
FIG. 4 contains graphs that show how the linearity of a radio-frequency amplifier used in receiving wireless signals may be adjusted in real time to control noise and amplifier power consumption in accordance with an embodiment of the present invention.

FIG. 4 is a graph showing how the amount of linearity exhibited by low noise amplifier 58 may be adjusted dynamically. During time period T1 of FIG. 4, radio-frequency signals are being transmitted on both a WiFi® band at about 2.4 GHz and a cellular telephone band such as Long Term Evolution band 5 or band 8 or a cellular telephone band such as band class 0 for a Code Division Multiple Access system), leading to the presence of undesired mixing product signals. During time period T2 of FIG. 4, one or both of these signals is not present, so the potential for interference with satellite navigation system receiver 35 is negligible (in this example).

In the upper trace of FIG. 4, the linearity of amplifier 58 has been plotted as a function of time t. During time periods LL, control signals are supplied to amplifier 58 that place amplifier 58 in a low linearity mode of operation. In the low linearity state, amplifier 58 exhibits linearity level L1. During time period HL, control signals are supplied to amplifier 58 that place amplifier 58 in a high linearity mode of operation. In the high linearity state, amplifier 58 exhibits linearity level L2. As shown in FIG. 4, linearity level L2 is larger than linearity L1.

Because linearity level L2 is larger than linearity level L1, the amount of noise that that is produced at output 64 of low noise amplifier 58 (e.g., noise resulting from a mixing product produced during simultaneous presence of wireless local area network signals and cellular telephone signals) is lower during time period HL than during time periods LL. As shown in the middle trace of FIG. 4, for example, noise level N3 may be present at the output of amplifier 58 during time periods LL, whereas reduced noise level N2 is present during time period HL. During time period T2, no significant noise is present due to the absence of noise-producing transmissions, as indicated by low noise level N1.

Noise level N3 is sufficiently large to impair proper operation of satellite navigation system receiver 35. Accordingly, whenever it is desired to operate satellite navigation system receiver 35, amplifier 58 is placed in high linearity mode by control circuitry 28. In high linearity mode, the noise that is present is reduced to noise level N2, which is sufficiently low to allow satellite navigation system receiver 35 to satisfactorily receive and process satellite navigation system signals from antenna structures 40.

To minimize power consumption in device 10, control circuitry 28 can limit the use of the high linearity mode for amplifier 58 to situations in which low noise level N2 is needed by receiver 35. In other times, such as when satellite navigation system receiver 35 is not operating or when substantial noise-producing transmissions are absent, amplifier 58 may be operated in low linearity mode. As shown in the lower trace of FIG. 4, power consumption is relatively high (PC2) when amplifier 58 is in high linearity mode (time period HL) and is relatively low (PC1) when amplifier 58 is in low linearity mode (time periods LL and time period T2).

Figure 5:
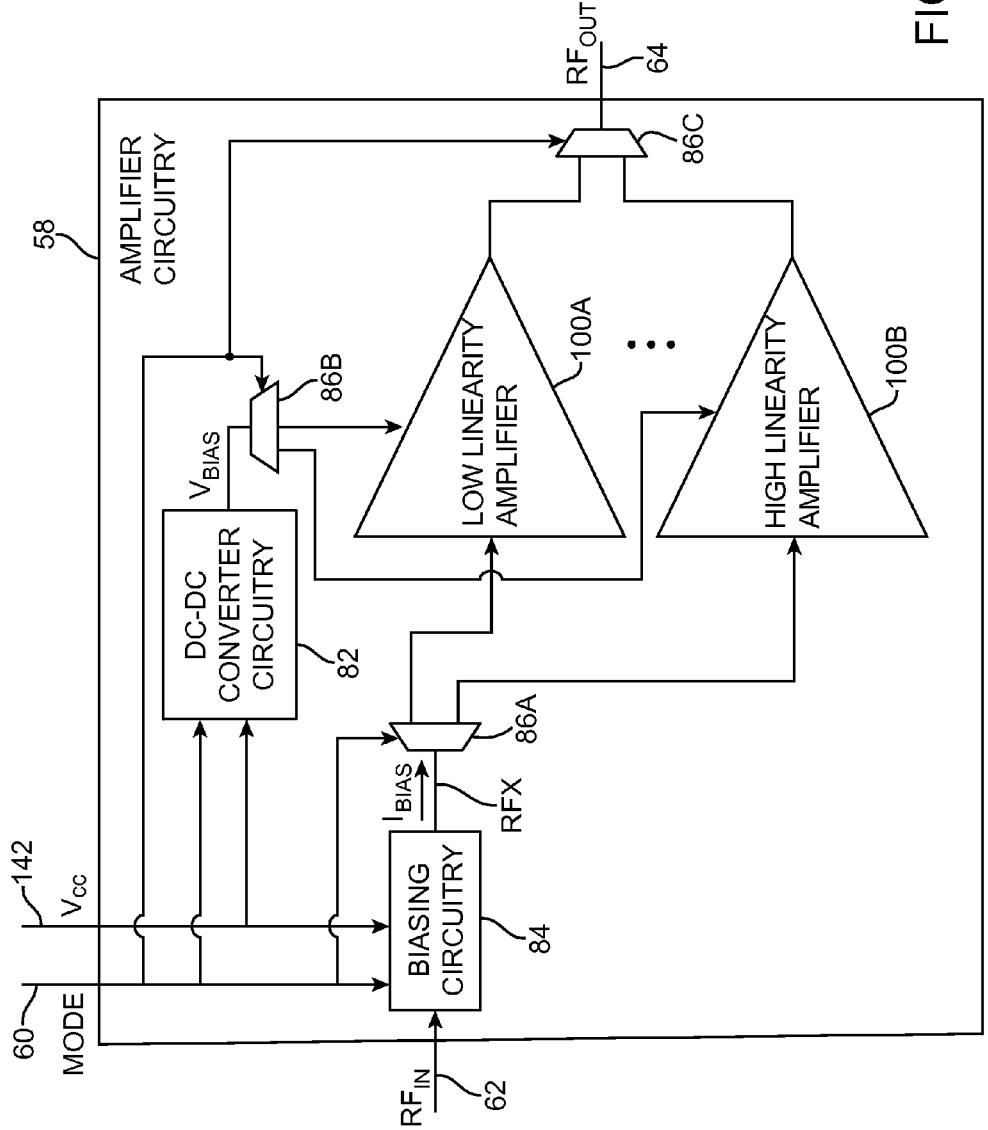
FIG. 5 is a diagram of illustrative amplifier circuitry with controllable linearity in accordance with an embodiment of the present invention.

FIG. 5 is a circuit diagram of illustrative circuitry that may be used in implementing adjustable-linearity-mode low noise amplifier 58. If desired, other types of circuits may be used to provide a low noise amplifier with adjustable linearity. The example of FIG. 5 is merely illustrative.

As shown in FIG. 5, amplifier circuitry 58 may include DC-DC converter circuitry 82, biasing circuitry 84, amplifiers 100A and 100B, and multiplexing circuits 86A, 86B, and 86C.

DC-DC converter circuitry 82 may receive supply voltage Vcc via path 142 (e.g., from power supply circuitry in device 10). DC-DC converter circuitry 82 may receive linearity mode control signals via path 60 (e.g., from storage and processing circuitry 28) and may provide a corresponding output bias voltage Vbias to multiplexing circuit 86B. Vbias may be used as a power supply voltage for amplifiers 100A and 100B. Bias voltage Vbias may be adjusted using mode control signals (control signals MODE from input 60) to provide a desired bias voltage to amplifiers 100A and 100B.

Biasing circuitry 84 may receive a radio-frequency input signal RFin via path 62 and the mode control signals MODE via path 60 and may produce an intermediate radio-frequency signal RFx with bias current Ibias. Bias current Ibias may be used to bias amplifiers 100A and 100B. For example, current Ibias may be used to bias the base terminals of bipolar junction transistors in amplifiers 100A and 100B. Bias current Ibias may be adjusted using the mode control signals MODE to provide a desired bias current to amplifiers 100A and 100B. If desired, amplifier circuitry 58 may include a digital to analog converter and control signals 60 may be provided in digital form. Alternatively, control signals 60 may be supplied to amplifier 58 in analog form.

Amplifiers 100A and 100B may provide respective amplification paths for amplifying radio-frequency input signal RFin. Amplifier 100A may be a low linearity power amplifier that exhibits a relatively low linearity (e.g., linearity level L1 of FIG. 4) and that consumes a relatively low amount of power (e.g., power PC1 of FIG. 4) to conserve power. Amplifier 100B may be a high linearity power amplifier that exhibits a relatively high linearity (e.g., linearity level L2 of FIG. 4) and that consumes a relatively high amount of power (e.g., power PC2 of FIG. 4).

Linearity mode control signals provided via path 60 may determine the operating mode of amplifier circuitry 58. For example, mode control signals MODE may direct power amplifier circuitry 58 to operate in a low linearity mode or a high linearity mode.

In the low linearity mode, DC-DC converter circuitry 82 may produce a relatively low bias voltage, biasing circuitry 84 may produce a relatively low bias current, and multiplexing circuits 86A, 86B, and 86C may select the amplification path that includes low linearity amplifier 100A. For example, the mode control signals may direct DC-DC converter circuitry 82 to produce a relatively low Vbias, may direct biasing circuitry 84 to produce intermediate signal RFx with a relatively low Ibias, and may direct multiplexers 86A, 86B, and 86C to route the relatively low Vbias to amplifier 100A and to route the intermediate signal RFx through amplifier 100A to output path 64 (e.g., to select the amplification path that includes low linearity amplifier 100A).

In the high linearity mode, DC-DC converter circuitry 82 may produce a relatively high bias voltage, biasing circuitry 84 may produce a relatively high bias current, and multiplexing circuits 86A, 86B, and 86C may select the amplification path that includes high linearity amplifier 100B. For example, the mode control signals may direct DC-DC converter circuitry 82 to produce a relatively high Vbias, may direct biasing circuitry 84 to produce intermediate signal RFx with a relatively high Ibias, and may direct multiplexers 86A, 86B, and 86C to route the relatively high Vbias to amplifier 100B and to route intermediate signal RFx through amplifier 100B to output path 30.

The example of FIG. 5 in which low noise amplifier circuitry 58 is provided with a low linearity amplification path and a high linearity amplification path is merely illustrative. If desired, amplifier circuitry 58 may be provided additional amplification paths. For example, amplifier circuitry 58 may be provided with a third amplification path optimized to satisfy a different set of linearity and power consumption requirements (e.g., a third amplification path that includes a medium linearity amplifier while consuming a medium amount of power).

Figure 6:
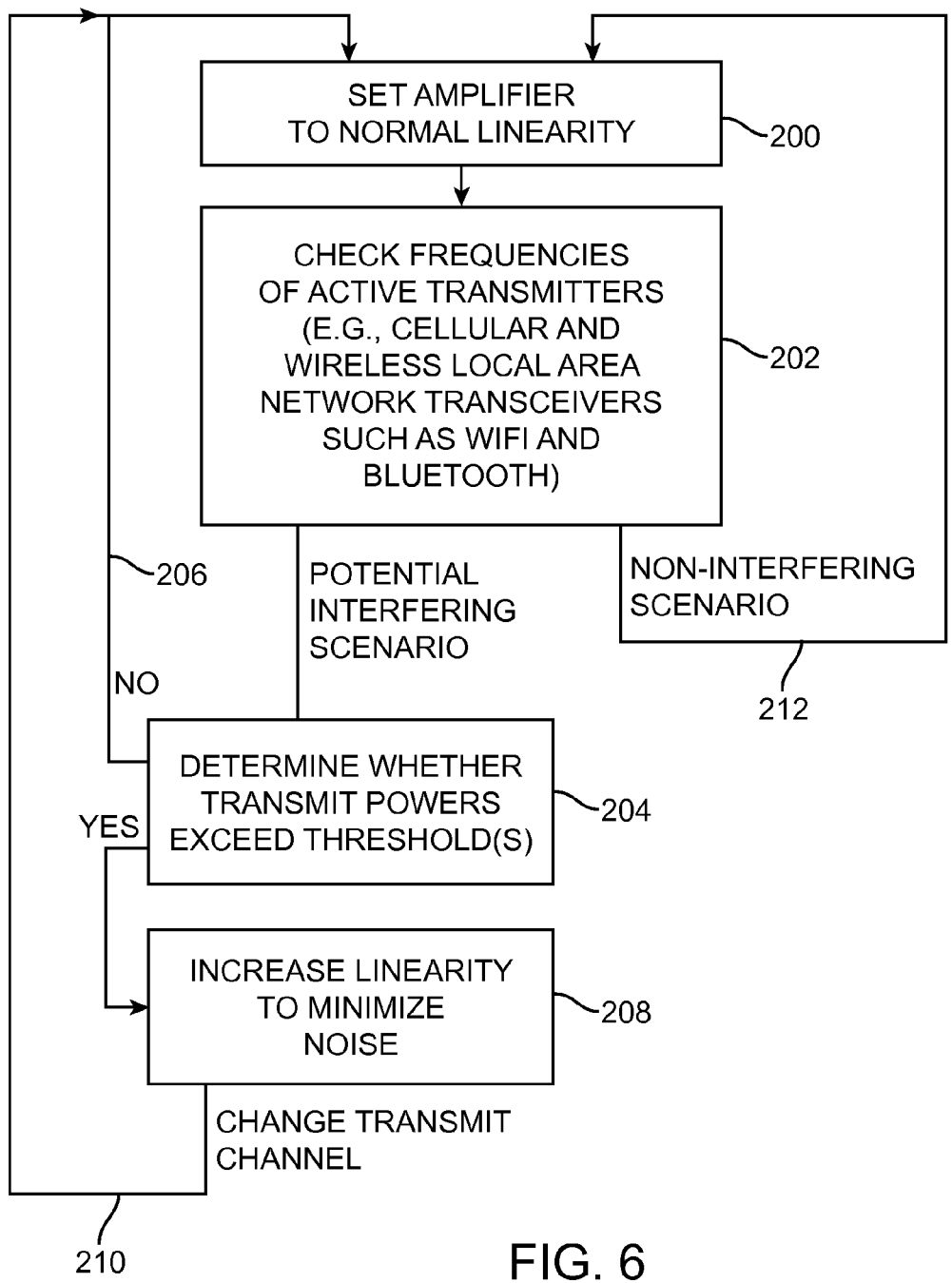
FIG. 6 is a flow chart of illustrative operations involved in operating a wireless electronic device to reduce interference while minimizing power consumption in accordance with an embodiment of the present invention.

FIG. 6 is a flow chart of illustrative steps involved in dynamically controlling the linearity of amplifier 58 to minimize interference between noise sources such as transmitters 44 and 48 and sensitive circuits such as receiver 35. At step 200, control circuitry 28 of device 10 may supply control signals to amplifier 58 using control input 60 that direct amplifier 58 to operate in a low linearity mode (e.g., a mode exhibiting linearity level L1).

During operation, control circuitry 28 (e.g., baseband processors such as processors 50 and 52 of FIG. 3 and/or an applications processor or other control circuitry in device 10) may maintain information on which transceiver circuitry is being used by device 10. For example, control circuitry 28 may maintain information on which wireless transmitters are being actively used to transmit radio-frequency signals through antenna structures 40, information on which frequencies are being used to transmit wireless radio-frequency signals, and information on which transmit powers are being used for each transmitted signal. Control circuitry 28 may also maintain information on which wireless receivers are active and information on which combinations of transmitted frequencies have the potential to generate interference for wireless receiver circuits in device 10.

During the operations of step 202, device 10 may use control circuitry 28 to ascertain the frequencies of actively transmitted wireless radio-frequency signals (i.e., the frequency associated with cellular telephone signals transmitted by transmitter 44, the frequency associated with local area network signals transmitted by transmitter 48, etc.). Device 10 may also use control circuitry 28 to determine whether the actively transmitted signals and mixing products resulting from the simultaneous presence of multiple transmitted signals poses a risk of interference for the active receiver circuitry (e.g., satellite navigation system receiver 35) in device 10 (e.g., due to the creation of mixing products in low noise amplifier 58).

In response to determining that the combination of transmitted signals does not pose a significant interference risk for the active receiver circuitry in device 10, processing may loop back to step 200, as indicated by line 212.

In response to determining that the combination of transmitted signals poses a risk of interference for the active receiver circuitry (i.e., in response to identifying that there is a potential for interference from mixing products to disrupt the operation of the receiver circuitry), device 10 may use control circuitry 28 to ascertain the transmit powers for each of the transmitted signals. Control circuitry 28 may then compare the powers of the transmitted signals to power threshold information. Circuitry 28 may, for example, compare each transmitted signal power to a corresponding predetermined threshold value. If the transmit power level for each of the transmitters (e.g., transmitter 44 and transmitter 48 in the example of FIG. 3), exceeds its corresponding threshold value, then device 10 may conclude that there is a risk for interference produced by non-linearity in amplifier 58. If the transmit power level for one or more of the signals being transmitted by the transmitters does not exceed its threshold, processing may loop back to step 200, as indicated by line 206.

In response to determining that there is a risk of interference resulting from the transmitted signals, control circuitry 28 may, at step 208, increase the linearity of low noise amplifier 58 (e.g., from linearity L1 to linearity L2, as shown in FIG. 4). Control circuitry 28 may, for example, supply digital or analog control signals to input 60 of amplifier 58 that change the current bias, the voltage bias and/or other settings in amplifier 58 to increase the linearity of amplifier 58 at the expense of increased power consumption. Control circuitry 28 may then monitor the status of device 10 to determine whether an event has occurred that warrants a return to the low linearity state for amplifier 58 and a rechecking of the transmit frequencies for the active transmitter. With one suitable arrangement, which is shown in the example of FIG. 6, control circuitry 28 monitors transmitters 44 and 48 to determine when a new frequency (i.e., a new transmit channel) is being used to transmit signals through antenna 40. In response to detection of a channel change event or other suitable criteria, processing may loop back to step 200, as indicated by lines 210.

The foregoing is merely illustrative of the principles of this invention and various modifications can be made by those skilled in the art without departing from the scope and spirit of the invention.

What is claimed is:

1. An electronic device, comprising:
   antenna structures;
   transmitter circuitry coupled to the antenna structures that is configured to transmit signals using the antenna structures;
   an adjustable-linearity amplifier that exhibits a linearity in amplifying radio-frequency signals from the antenna structures;
   receiver circuitry coupled to the antenna structures by the adjustable-linearity amplifier; and
   control circuitry that is configured to dynamically adjust the linearity of the adjustable-linearity amplifier based at least partly on the information on which frequencies are currently being used by the transmitter circuitry in transmitting the signals using the antenna structures.

2. The electronic device defined in claim 1 wherein the antenna structures include at least one antenna, wherein the adjustable-linearity amplifier has an input that is coupled to the antenna and that receives the radio-frequency signals from the antenna, wherein the adjustable-linearity amplifier has an output at which amplified radio-frequency signals are provided to the receiver circuitry, and wherein the adjustable-linearity amplifier has a control input that receives linearity adjustment control signals from the control circuitry.

3. The electronic device defined in claim 2 wherein the control circuitry is configured to maintain information on which frequencies are currently being used by the transmitter circuitry in transmitting the signals using the antenna structures.

4. The electronic device defined in claim 1 wherein the control circuitry is configured to determine whether there is a potential for the signals transmitted by the transmitter circuitry to cause interference for the receiver circuitry using the information on which frequencies are currently being used by the transmitter circuitry.

5. The electronic device defined in claim 1 wherein the control circuitry is configured to determine whether there is a potential for the signals transmitted by the transmitter circuitry to cause interference for the receiver circuitry using information on which transmit powers are currently being used by the transmitter circuitry in transmitting the signals using the antenna structures.

6. The electronic device defined in claim 5 wherein the control circuitry is configured to determine whether there is a potential for the signals transmitted by the transmitter circuitry to cause interference for the receiver circuitry using the information on which frequencies are currently being used by the transmitter circuitry.

7. The electronic device defined in claim 1 wherein the transmitter circuitry includes a cellular telephone transmitter.

8. The electronic device defined in claim 7 wherein the transmitter circuitry includes a wireless local area network transmitter.

9. The electronic device defined in claim 8 wherein the receiver circuitry comprises a satellite navigation system receiver.

10. The electronic device defined in claim 9 wherein the adjustable-linearity amplifier is operable in at least a first linearity mode in which the adjustable-linearity amplifier exhibits a first linearity and a second linearity mode in which the adjustable linearity amplifier exhibits a second linearity that is greater than the first linearity, and wherein the control circuitry is configured to place the adjustable-linearity amplifier in the second linearity mode in response to determining that the cellular telephone transmitter is transmitting at a first frequency, that the wireless local area network transmitter is transmitting at a second frequency, and that a difference frequency equal to the second frequency minus the first frequency falls within a receive band for the satellite navigation system receiver.

11. An electronic device, comprising:
a cellular telephone transmitter that transmits a cellular telephone signal at a first frequency;
a wireless local area network transmitter that transmits a wireless local area network signal at a second frequency;
an adjustable-linearity amplifier that is characterized by a linearity when amplifying;
wireless receiver circuitry that receives signals in a receive band from the adjustable-linearity amplifier; and
control circuitry configured to adjust the linearity to minimize interference in the receive band at least partly in response to determining that the second frequency minus the first frequency falls within the receive band.

12. The electronic device defined in claim 11 wherein the cellular telephone signal has a first power, wherein the wireless local area network signal has a second power, wherein the control circuitry is configured to compare the first and second powers to respective first and second threshold values, and wherein the control circuitry is configured to adjust the linearity at least partly in response to determining that the first and second powers respectively exceed the first and second threshold values.

* * * * *